United States Patent [19]

Boyer et al.

[11] 4,158,172

[45] Jun. 12, 1979

[54] DIGITAL SPEEDOMETER FOR INDICATING VELOCITY IN AT LEAST TWO SELECTABLE UNITS OF MEASUREMENT

[75] Inventors: Curtis E. Boyer, Canton Township, Oakland County; Jacques Mosier, South Lyon, both of Mich.

[73] Assignee: Ford Motor Company, Dearborn, Mich.

[21] Appl. No.: 857,539

[22] Filed: Dec. 5, 1977

[51] Int. Cl.² .............................................. G01P 3/54
[52] U.S. Cl. .................................. 324/166; 324/160; 324/175; 235/92 FQ
[58] Field of Search ................. 324/115, 78 D, 78 Z, 324/79 D, 160, 161, 166, 173, 175, 178; 364/565; 340/263, 347 SH; 235/92 TF, 92 FQ; 73/506, 518; 180/705

[56] References Cited

U.S. PATENT DOCUMENTS

| 3,039,685 | 6/1962 | Bagley et al. | 324/79 D |
|---|---|---|---|
| 3,525,044 | 8/1970 | Richmond | 324/173 |
| 3,530,382 | 9/1970 | Liston et al. | 324/173 |
| 3,614,617 | 10/1971 | Blake, Jr. | 324/166 |
| 3,704,445 | 10/1972 | Lanham | 324/175 |
| 3,835,382 | 9/1974 | Weisbart | 324/161 |
| 3,863,153 | 1/1975 | Eshraghian | 324/166 |
| 3,868,570 | 2/1975 | Kopera, Jr. | 324/166 |
| 3,962,567 | 6/1976 | Oicles et al. | 239/92 EA |

OTHER PUBLICATIONS

T. S. Mereness, "Bicycle Tachometer/Speedometer", IBM Technical Disclosure Bulletin, vol. 17, No. 9, Feb. 1975, pp. 2570-2571.

Primary Examiner—Rudolph V. Rolinec
Assistant Examiner—Walter E. Snow
Attorney, Agent, or Firm—Robert W. Brown; Clifford L. Sadler

[57] ABSTRACT

A digital speedometer for indicating angular or linear velocity has an index counter to control update of the displayed velocity. The purpose of the index counter is to prevent undesirable fluctuation of the displayed velocity where minor variations in velocity being measured have occurred. The digital speedometer uses a pulsating input signal having a frequency proportional to the velocity to be indicated. An oscillator circuit provides a clock frequency that is utilized in generating a counting period electrical signal. During the counting period, the input pulses proportional to velocity are gated into a counter. After each counting period, a comparison is made between the count currently being displayed and the count stored in the counter. If a difference occurs, the index counter is incremented. Only after the index counter has been incremented a plurality of consecutive times is the display permitted to be updated.

7 Claims, 2 Drawing Figures

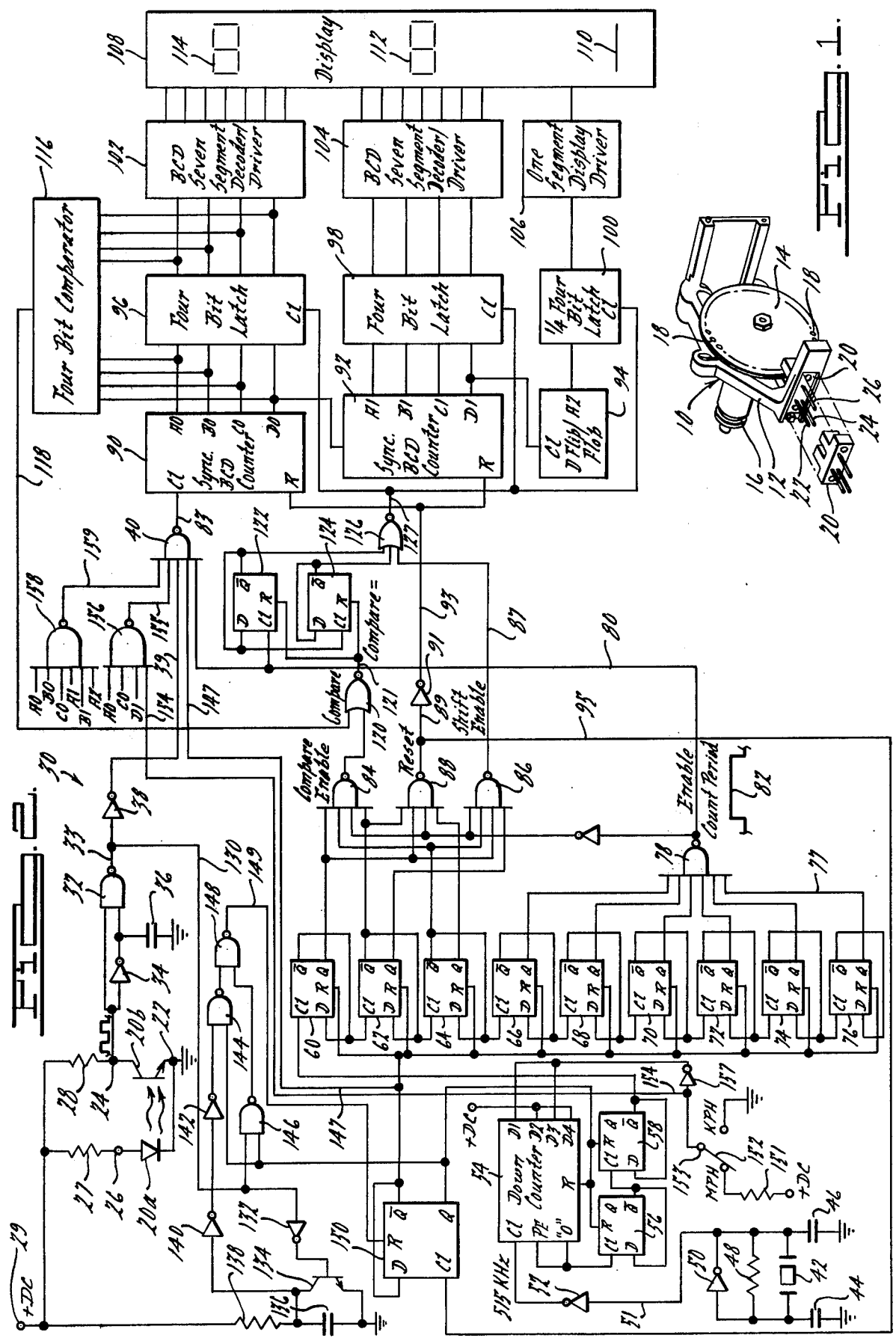

DIGITAL SPEEDOMETER FOR INDICATING VELOCITY IN AT LEAST TWO SELECTABLE UNITS OF MEASUREMENT

BACKGROUND

This invention relates to a digital speedometer for indicating angular or linear velocity of a moving object. More particularly, the invention relates to a digital speedometer for indicating motor vehicle velocity with update of the displayed velocity being controlled by an index counter.

A digital speedometer for indicating the velocity of a motor vehicle displays changes in velocity that occur during accelerations and decelerations by changing the displayed numerals. High rates of acceleration or deceleration produce rapid fluctuations in the displayed numerals, but when vehicle velocity stablizes it becomes desirable to prevent minor variations in vehicle speed from causing fluctuations in the displayed velocity. Prior art systems have measured the rate of change of vehicle speed and utilized such measurements in controlling the manner in which displayed velocities are updated. These systems tend to become quite complex.

The present invention provides means for preventing fluctuation in displayed vehicle velocities where actual velocity variation is minor and oscillatory in character.

SUMMARY OF THE INVENTION

The invention provides a digital speedometer for indicating angular or linear velocity based upon a speed measurement represented by a pulsating electrical signal having a pulse repetition frequency proportional to the angular or linear velocity to be indicated. A counting period electrical signal is repetitively generated. The counting period signal controls an electronic gate that, during the counting period, permits the pulsating electrical signal to be supplied as the input to a resettable binary counter. At the end of the counting period, the binary counter will have stored in it a binary count representative of the velocity to be indicated. A latch interconnects the output of the binary counter with a decoder/driver circuit which, in turn, is coupled to a display means for indicating, in decimal numerals, the binary number represented on the output of the latch.

A comparator compares the latch output with the latch input, the latter being obtained as the output of the binary counter. If, after each counting period, the comparator indicates no change or difference between the displayed count and the count at the output of the binary counter, a signal is provided which resets an index counter. The index counter is, in the preferred form, comprised of two cascaded type-D flip flops that together produce a count-to-four function. If, on the other hand, the comparator indicates difference between the displayed count and the output of the binary counter, the comparator produces a signal which causes the index counter to be incremented by one count. If this happens for four consecutive counting periods, the index counter produces an output signal which causes the latch to transfer the binary counter output signal to the decoder/driver circuit and consequently to the display. The requirement for four consecutive counting period difference signals prevents fluctuation in the display indication due to minor variations in the frequency of the sensed input signal representative of the velocity to be indicated.

In addition to the above, the invention also provides improvements in the circuitry utilized to synchronize and control the gating of input pulses into a binary counter of a digital speedometer.

The invention may be better understood by reference to the detailed description which follows and to the drawings.

BRIEF DESCRIPTION OF THE DRAWINGS

FIG. 1 is a perspective view of a pulse generator suitable for use with a digital speedometer; and FIG. 2 is a schematic electrical diagram of a digital speedometer for a motor vehicle.

DETAILED DESCRIPTION

In the description which follows, the term "logic zero level" refers to a voltage signal that is at or near ground potential and the term "logic one level" refers to a voltage that is positive with respect to ground and higher than that corresponding to a logic zero level.

With particular reference to FIG. 1, there is shown means for generating pulses having a repetition frequency proportional to vehicle velocity. The device, generally indicated by the numeral 10, includes a frame 12 having a disc 14 that is driven by a conventional motor vehicle speedometer cable (not shown) connected at 16 to rotatably drive the disc 14. The speedometer cable and disc preferably are coupled to the speed-sensing output of a conventional motor vehicle transmission. Preferably, the disc 14 makes 1000 revolutions per mile driven by the vehicle.

The disc 14 preferably has ninety-six slots 18 that are equally spaced from one another around the disc circumference. The periphery of the disc is positioned between projecting portions of an optical limit switch 20. The optical limit switch comprises a light-emitting diode and a photo-transistor which are mounted in the respective projecting portions between which the periphery of the disc 14 rotates. The optical limit switch 20 is shown mounted in the frame 12 in FIG. 1 and also is shown separate from the frame, limit switch 20 may be of the MCT8 type commercially available from the Electronic Special Products Division of Monsanto, Inc. Terminals 22, 24 and 26 extend from the optical limit switch.

As the disc 14 rotates, the slots 18 along its periphery come into and go out of alignment with a light beam emitted by the light-emitting diode in the optical limit switch. This repeatedly interrupts the light impinging on the base of the photo-transistor and causes voltage pulses to occur at its collector, which is connected to terminal 24. A disc 14 having ninety-six slots 18 and making 1000 revolutions per mile of vehicle travel causes 96,000 pulses to be generated at terminal 24 for each mile of vehicle travel. The pulse repetition frequency then is 26.66 pulses per second for each mile per hour of vehicle speed. To convert this sensor response to metric units, it should be noted that 96,000 pulses per mile is equal to 59,652 pulses per kilometer which, in turn, corresponds to 16.57 pulses per second for each kilometer per hour.

A pulse repetition frequency of 26.66 pulses per second is equal to one pulse per 37.5 milliseconds and, therefore, each pulse occurring during a 37.5 millisecond interval represents one mile per hour. Similarly, 16.57 pulses per second is equivalenet to one pulse per 60.35 milliseconds and, therefore, each pulse occurring during an interval of 60.35 milliseconds represents one kilometer per hour.

With particular reference now to FIG. 2, there is shown a preferred schematic electrical diagram of a digital speedometer incorporating the improvements of the invention. This circuit is constructed with CMOS integrated circuit components. For large-scale production, a custom integrated circuit implementation is preferred and would include most of the components schematically illustrated in FIG. 2. In the alternative, the circuit may be constructed with commercially available components, and appropriate device type numbers are given herein where this appears necessary to exemplify the availability of such components.

The circuit of FIG. 2 is intended to provide a digital display of motor vehicle speed in either miles per hour or kilometers per hour, as selected by a switch. In the operation of the circuit, input pulses representative of vehicle speed are supplied to a gate that is controlled by a time-interval generating circuit. The time interval is represented by a counting period signal that controls how many of the speed dependent input pulses enter a synchronous binary-coded decimal (BCD) counter. The count accumulated in the counter at the end of the counting period may be displayed to provide an indication of vehicle speed.

The digital speedometer is generally designated in FIG. 2 by the numeral 30. The pulse input portion of circuit 30 includes components 20a, 20b, 27, 28, 32, 34, 36, and 38. Component 20a is the light-emitting diode and component 20b is the phototransistor of the optical limit switch 20 previously described in connection with FIG. 1. The output signal appearing at terminal 24, the collector of the phototransistor 20b, is an essentially square wave signal having a pulse repetition frequency proportional to motor vehicle speed. For purposes of the following description, this signal at terminal 24 will be assumed to have the relationship to vehicle speed described in the preceding paragraphs. The pulses appearing at terminal 24 are supplied to a control gate 40. Transmission of these pulses through control gate 40 can take place only during a counting period that repetitively recurs. The counting period is established by a circuit that includes components 42, 44, 46, 48, 50, 52, 54, 56, 58, 60, 62, 64, 66, 68, 70, 72, 74, 76, and 78. Component 78 is a NAND-gate having an output lead 80 on which a signal 82 appears. This signal is a pulse having a width or duration of slightly more than 37.5 or slightly more than 60 milliseconds depending, respectively, upon whether the digital speedometer is indicating miles per hour or kilometers per hour.

The signal on lead 80 is applied to the control gate 40 and determines the length of time during which the vehicle speed dependent pulses occurring at terminal 24 are passed through the control gate 40 to the clock input lead 83 of a synchronous BCD counter comprising components 90, 92 and 94. Each pulse that enters the synchronous BCD counter represents either one mile per hour or one kilometer per hour depending upon the selected length for the counting period. The counting period is determined by the width or duration of the pulse 82 on lead 80. At the end of the counting period, which occurs upon termination of the pulse 82, three short-duration pulses are serially generated at the respective outputs of NAND-gates 84, 86, and 88. These short-duration pulses are control signals whose specific functions are hereinafter described in detial.

The BCD counter comprising components 90, 92 and 94 is a nine-bit counter having output terminals A0, B0, C0, D0, A1, B1, C1, D1, ad A2. These terminals here are mentioned in their ascending order of mathematical significance. The terminals of the BCD counter are connected to respectively corresponding terminals of a nine-bit latch including components 96, 98, and 100. The nine-bits are comprised of two four-bit latches (96 and 98) and one-quarter of a third four-bit latch (100). The output terminals of the four-bit latch 96 are connected to the input terminals of a BCD seven-segment decoder/driver 102; the four output terminals of latch 98 form the input to a similar decoder/driver 104 and the single output of latch 100 forms the input to a one-segment display driver 106. The control lead from display driver 106 controls a single-segment 110 of a digital display 108. The decoder/driver 104 controls the seven-segments of a digit 112 in the display and the decoder/driver 102 controls the seven-segment digit 114 in the display. Digit 110 in the display is the most significant and digit 114 is the least significant. The digital display 108 provides visual indication of motor vehicle speed in either miles per hour or kilometers per hour. In most speedometer applications, vehicle speed indication is always less than 100 miles per hour and, thus, only the digits 112 and 114 are required. Where kilometers per hour are indicated, the single-segment digit 110 is required to permit indication of speeds in excess of 100 kilometers per hour. If speeds in excess of 200 miles or kilometers per hour are to be displayed, the digit 110 may be a seven-segment digit controlled in a manner similar to that shown for the control of the digit 112.

Preferably, the digital display 108 is of the vacuum fluorescent type. Suitable decoder/drivers for this display are available as part number DI 512 available from Dionics, Inc. of Westbury, N.Y. The sychronous BCD counters and four-bit latches may be, respectively, type numbers MC14518 and MC14042 available from Motorola Semiconductor Products Inc. Component 94 is illustrated as a type D flip-flop. This device instead could be one-quarter of a BCD counter of Motorola type MC14518. Similarly, a type D flip-flop could be substituted for the component 100.

A four-bit comparator 116 is used to compare the magnitude of the four least-significant bits in the BCD counter output with the four least-significant bits on the output leads of the four-bit latch 96, these four bits at the output of latch 96 controlling the digit 114 display. The output lead of the comparator 116 is applied via a lead 118 to one input of a NOR-gate 120 whose output forms the input to an index counter. The index counter includes type D flip-flops 122 and 124 and a NOR-gate 126.

The function of the index counter is to prevent the count stored in the BCD counter from being transferred to the output of the latch unless, for four consecutive count periods each of which is determined by the duration of the pulses 82, the comparator 116 indicates that the displayed speed, as determined by the output of the four-bit latch 96, has been different than the count stored in the BCD counter. In other words, the index counter components 122 and 124 are capable of counting to four. Each time, at the end of a count period, the four-bit input to the latch 96 is different than its four-bit output, the comparator 116 causes the index counter to increment by one. When the count in the index counter reaches four, the nine-bit latch including components 96, 98 and 100 is actuated to transfer the BCD counter output to the decoder/drivers for digits 110, 112 and 114, thereby, to change the displayed speed indication. However, whenever the four-bit comparator 116 indicates that the four-bit input to the latch 96 is the same or equal to its four-bit output, the index counter components 122 and 124 are reset to zero. Thus, four consecutive different comparisons by the comparator 116 must occur before the speed display can be changed. The purpose of this is to prevent undersirable fluctuations in the displayed speed indication which might otherwise occur due to slight variations in vehicle speed. Four consecutive comparisons have been found to be suitable for automotive applications, but a greater or lesser plurality of preferably consecutive comparisons may be used to prevent a fluctuating display.

In the paragraphs which follow, the circuit 30 is described in greater detail.

In the circuit 30 suitable DC voltages are provided to the various gates and other integrated circuit components. In the input circuit, a positive DC voltage is applied at a terminal 29 and causes a current to flow through resistor 27 and light-emitting diode 20a. The light emitted by the diode is directed to the base of the phototransistor 20b, but this light is repetitively interrupted by the rotating disc 14 (FIG. 1). As a result, the previously described pulses proportional to vehicle speed appear at terminal 24. The signal at terminal 24 is applied to one input of the NAND-gate 32 and is applied to the other input of this NAND-gate through the inverter 34. When the signal at terminal 24 is at a low voltage level, capacitor 35 is charged and applied a logic one level to the input of NAND-gate 32 to which this capacitor is attached. Since its other input is at the low voltage level, the output of NAND-gate 32 is a logic one level at this time. When the signal at terminal 24 goes to a high voltage level, the inverter 34 causes the capacitor 36 to be discharged, but prior to this discharge, the output of the NAND-gate 32 will have gone to a low voltage level. Thus, the signal on the output lead 33 of NAND-gate 32 follows the signal at terminal 24. Inverter 38 inverts this signal and applies it via its output lead 39 to the control gate 40.

Control 40 is a NAND-gate having five inputs. Input 39 carries the pulses which occur at a rate proportional to vehicle speed. The other four inputs are intended either to allow or prevent these vehicle speed dependent pulses from entering the clock input 83 of the BCD counter 90. Input 155 to the control gate 40 is obtained from the output of a four-input NAND-gate 156. Normally, lead 155 is at a logic one level and does not prevent the speed dependent pulses on input lead 39 from passing through the gate 40. However, the gate 156 has its input lead 154 connected to the pole 153 of a single-pole, double-throw switch 152. This switch 152 determines whether miles per hour or kilometers per hour are indicated on the display 108. When the switch 152 is positioned as indicated in FIG. 2, a logic one level appears on lead 154 as a result of its connection to a +DC source through a resistor 151 and the display 108 indication is in units of miles per hour. When the switch 152 is in its other position, a logic zero level appears on lead 154 and kilometers per hour appear on the display 108.

NAND-gate 156, in addition to having the lead 154 as one of its inputs, has inputs A0, C0, and D1 from the output terminals of the BCD counter. With these connections, and with the switch 152 in its miles per hour indicating position, a logic zero level signal appears on output lead 155 of gate 156 whenever the count in the BCD counter reaches 85. This closes the gate 40 such that the speed dependent pulses on its input 39 cannot enter the clock input of the BCD counter. Therefore, the displayed speed is not permitted to exceed 85 miles per hour even though vehicle speed actually may be greater than this.

When the switch 152 is in its kilometers per hour indicating position, a logic zero level signal is applied on input lead 154 to the NAND-gate 156 so that its output on lead 155 is always at a logic one level. However, a NAND-gate 158 has an output lead 159 forming an input to the control gate 40 and has inputs A0, B0, C0, A1, B1, and A2 from the BCD counter. With these connections, the count in the BCD counter is permitted to go to 137 as a maximum, which is the numerical equivalent in kilometers per hour of 85 miles per hour. When the count in the BCD counter reaches 137, a logic zero level signal appears on input lead 159 to the control gate 40 and no further pulses on lead 39 are permitted to enter the BCD counter. Thus, the kilometers per hour display cannot exceed 137 even though vehicle speed may be greater than this.

Component 42 in the time-interval or count-period generating circuitry preferably is a piezoelectric ceramic resonator of the type commercially available from the Radio Materials Company, a division of P. R. Mallory and Company, Inc. The resonator 42 is used in conjunction with capacitors 44 and 46, resistor 48 and inverter 50 to generate a 515 KHz signal on lead 51. This signal is inverted by the inverter 52 and applied to the clock input of a down counter 54, which preferably is of the type MC14526 available from Motorola, Inc.

Down counter 54 has programmable data inputs D1, D2, D3 and D4, here mentioned in ascending order of bit significance. Each time the preset enable (PE) input of the down counter receives a logic zero level signal from the "0" output of the counter, the counter is reset with a binary number determined by the input applied to its data input terminals. When the switch 152 is in its mile per hour indicating position as shown in FIG. 2, logic zero level signals are applied through inverter 157 to the D1 and D3 data inputs of the counter 54. Thus, the down counter 54 divides by 10 when switch 152 in the miles per hour position. However, when switch 152 is in the kilometers per hour position, logic one level signals are applied to all of the data inputs of the down counter 54 and it then divides by 16.

Type D flip-flops 56, 58, 60, 62, 64, 66, 68, 70, 72, 74, and 76 constitute a chain of divide-by-two devices. With a 515 KHz signal applied to the clock input of the down counter 54 and with the switch 152 in its miles per hour position, a square wave signal appears at the Q-output lead 77 of the flip-flop 76, which is at a logic zero level for 19.9 milliseconds. Subsequently, each of the input leads to the NAND-gate 78 from the flip-flops 74, 72, 70, 68 and 66, sequentially change from logic zero levels to logic one levels after time delays that are progressively one-half of the preceding time delay. The result is that the count period pulse 82 is generated at the output of the NAND-gate 78. This count period pulse has a duration of about 39.1 milliseconds. However, when the switch 152 is in the kilometers per hour position, the count period pulse 82 has a duration of about 62.6 milliseconds.

To provide an exact display of vehicle speed in units of miles per hour or kilometers per hour, the count periods would be, respectively, 37.5 and 60.35 milliseconds. However, by making the count periods slightly in excess of the specified value for exact vehicle speed display, assurance is provided that the display always will be in excess of actual vehicle speed and not less than the actual vehicle speed.

The count period pulse 82 on lead 80 is applied to the control gate 40 and permits the vehicle speed dependent pulses on input lead 39 of control gate 40 to pass into the clock input of the BCD counter 90, which is cascaded with BCD counter 92 and type D flip-flop 94. Each pulse entering the BCD counter represents one mile per hour or one kilometer per hour, depending upon the position of switch 152. At the end of the count period, a binary coded decimal number representative of vehicle speed is stored within the BCD counter. The four-bit comparator 116 determines whether this count is different than the count currently displayed or if the stored count is equal to the displayed count. If the displayed number is equal to the BCD counter number, a logic one level signal appears on lead 118, but if they are different, a logic zero level appears on lead 118.

As was previously stated, at the end of the count period defined by waveform 82, a short duration pulse is produced at the output of NAND-gate 84, then another is produced at the output 87 of NAND-gate 86 and finally a third is produced at the output 89 of NAND-gate 88. The pulse out of NAND-gate 84 is applied to one input of a NOR-gate 120 the other input to which is the comparison signal on lead 118. If the comparison shows the BCD counter output number to be different than that indicated on the display 108, then no pulses pass through the NOR-gate 120. On the other hand, if the comparison shows equality of the two numbers, a pulse appears on the output lead 121 of the NOR-gate 120 and this resets the index counter flip-flops 122, 124.

A shift enable pulse is produced on the output lead 87 of NAND-gate 86. The shift enable pulse is used to enable a pulse to be transferred to the output lead 127 of the NAND-gate 126, but only if a count of four is stored in the index counter flip-flops 122 and 124. If a pulse occurs on lead 127, it is applied to the clock inputs of the four-bit latches 96, 98 and 100 causing the vehicle speed count stored in the BCD counter to be shifted to the output leads of the latches and thus indicated on display 108. The zero-to-one logic level transitions occurring on lead 80 at the beginning of each count period clock the flip-flop 122 so that four such transitions are required in order to produce a shift output pulse on lead 127. If a comparison output pulse appears on lead 121 prior to the accumulation of such count in the index counter, the index counter is reset.

Following the occurrence of the shift enable pulse on lead 86, the short duration pulse then appearing on the output lead 89 of NAND-gate 88 resets the BCD counter, via inverter 91 and its output lead 93, and also is applied, via a lead 95, to the clock input of a type D flip-flop 150 used to provide synchronous gating in the circuit 30.

Prior to this time, the $\overline{Q}$ output of the flip-flop 150 is at a logic one level and its Q-output is at a logic zero level. The pulse occurring at the clock input of flip-flop 150 causes the Q-output of the flip-flop to go to a logic one level, which logic one level then is applied to one of the inputs of each of NAND-gates 144 and 146. The input pulses appearing on lead 130 are applied to the other input of NAND-gate 146 causing its output to oscillate between logic zero and logic one levels.

Resistor 138 and capacitor 136 are connected in series between the positive DC voltage applied at terminal 29 and ground potential. A transistor 134 has its collector-emitter output circuit connected in parallel with the capacitor 136 and has its base connected to the output of an inverter 132 whose input also is tied to the lead 130 on which input pulses occur. The collector of transistor 134 is connected through inverters 140 and 142 to the second input to the NAND-gate 144. The input pulses on lead 130, after inversion by inverter 132, repeatedly trigger the transistor 134 causing it to discharge the capacitor 136, which repeatedly charges through the resistor 138. This causes an oscillatory voltage level to occur on the collector of the transistor 134. As a result, coinciding pulses appear at the inputs of the NAND-gate 148 and a pulse occurs at its output lead 149 that is applied to the reset input to the flip-flop 150.

The pulse at the reset input of the flip-flop 150 causes its Q-output to go to a logic zero level and causes its $\overline{Q}$-output to go to a logic one level. The logic one level signal on the $\overline{Q}$-output of the flip-flop 150 is applied via lead 147 as an input to the control gate 40. The occurrence of the logic one level on lead 147 is coincidental with the occurrence of a speed dependent input pulse on the input lead 39 of the control gate 40. Thus, synchronization of the initiation of the count period with the occurrence of an input pulse on lead 39 is achieved.

When the time between speed dependent input pulses occurring on lead 130 is greater than the count period, the synchronous gating provided by flip-flop 150 would cease were it not for the fact that a pulse still appears on lead 149 and resets the flip-flop 150. This permits the control gate 40 to continue to open even though vehicle speed may be less than one mile per hour or one kilometer per hour, whichever is being displayed. This is important in order to permit a speed indication of zero to be displayed when the vehicle speed is actually zero.

If the vehicle speed is zero, pulses cease to appear at terminal 24 in the input circuitry. The voltage at terminal 24 may be either high or low depending upon the position of the disc 14 (FIG. 1). However, in either case, a logic one level signal will appear on output lead 33 of NAND-gate 32 and a logic zero level signal will appear on lead 39 so that the display will be made to read zero. If the voltage at input terminal 24 is at a low level, then the output of NAND-gate 32 is at a logic one level because one of its inputs is at a logic zero level. If the voltage at terminal 24 is at a high level, then the inverter 34 causes a logic zero level to appear at one of the inputs of the NAND-gate 32 thereby causing its output again to be at a logic one level.

Based upon the foregoing description of the invention, what is claimed is:

1. A digital speedometer for indicating angular or linear velocity in at least two selectable units of measurement, which comprises:

means for generating a pulsating electrical signal having a pulse repetition frequency proportional to the angular or linear velocity to be indicated;

means for repetitively generating a counting period electrical signal having a predetermined duration representative of a counting period;

a binary counter having an input terminal and a plurality of output terminals, said binary counter being able to count pulses occurring at its input terminal and being able to retain the count in the form of a binary number electrical signal at its output terminals;

means for gating said pulsating electrical signal into said input terminal of said binary counter during said counting period;

circuit means, coupled to said binary counter, for providing a visible display of the magnitude of the count stored in said binary counter at the end of said counting period, said visible display being in decimal system numerals equivalent in magnitude to the binary number count to be displayed;

switch means for selecting between first and second voltage levels, the selected voltage level being applied to said means for generating said counting period electrical signal and determining the duration of said counting period, said first voltage level when so applied causing said visible display to be in a first unit of measurement and said second voltage level when applied causing said visible display to be in a second unit of measurement, and circuit means for preventing said display means from indicating a velocity in excess of a predetermined velocity applicable to the unit of measurement being displayed.

2. A digital speedometer according to claim 1 wherein said first unit of measurement is a metric system unit of velocity and said second unit of measurement is an English system unit of velocity.

3. A digital speedometer according to claim 1 wherein said means for generating said counting period electrical signal comprises oscillator means for generating a clock frequency electrical signal and means for dividing said clock frequency electrical signal, thereby, to produce said counting period electrical signal, said voltage level selected by said switch means determining the number by which said clock frequency electrical signal is divided and the duration of said counting period.

4. A digital speedometer according to claim 3 wherein said counting period, when said first voltage level is selected by said switch means, is about 1.6 times the duration of said counting period when said second voltage level is selected by said switch means.

5. A digital speedometer according to claim 4 which includes circuit means for preventing said display means from indicating a velocity in excess of a predetermined velocity applicable to the unit of measurement being displayed.

6. A digital speedometer according to claim 5 wherein said switch means controls the selection of said predetermined velocity.

7. A digital speedometer according to claim 5 wherein said means for preventing said display means from indicating a velocity in excess of a predetermined velocity comprises second gate means, said second gate means having an input coupled to said switch means and inputs coupled to selected output terminals of said binary counter, said second gate means having an output coupled to said means for gating said pulsating electrical signal into said input terminal of said binary counter, thereby, to prevent said pulsating electrical signal from being applied to said binary counter input terminal when said binary counter has stored within it a binary count equivalent to said predetermined velocity.

* * * * *